(12) United States Patent
Kanayama et al.

(10) Patent No.: US 8,367,030 B2
(45) Date of Patent: Feb. 5, 2013

(54) THIN FILM OF METAL-SILICON COMPOUND AND PROCESS FOR PRODUCING THE THIN FILM OF THE METAL-SILICON COMPOUND

(75) Inventors: Toshihiko Kanayama, Tsukuba (JP); Noriyuki Uchida, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 281 days.

(21) Appl. No.: 12/919,443

(22) PCT Filed: Feb. 25, 2009

(86) PCT No.: PCT/JP2009/053422
§ 371 (c)(1),
(2), (4) Date: Aug. 25, 2010

(87) PCT Pub. No.: WO2009/107669
PCT Pub. Date: Sep. 3, 2009

(65) Prior Publication Data
US 2011/0002833 A1 Jan. 6, 2011

(30) Foreign Application Priority Data

Feb. 28, 2008 (JP) ................................. 2008-048520
Sep. 9, 2008 (JP) ................................. 2008-230650
Feb. 20, 2009 (JP) ................................. 2009-037261

(51) Int. Cl.
*C01B 21/068* (2006.01)
(52) U.S. Cl. ........................................ 423/344; 438/384
(58) Field of Classification Search .................. 423/344; 438/384; 501/154
See application file for complete search history.

(56) References Cited

U.S. PATENT DOCUMENTS 4,539,054 A 9/1985 Morimoto et al.

FOREIGN PATENT DOCUMENTS

| JP | 58-190815 | 11/1983 |
| JP | 02-080554 | 3/1990 |
| JP | 2000-178713 | 6/2000 |
| JP | 2000-327319 | 11/2000 |
| JP | 2001-081563 | 3/2001 |
| JP | 2008-28125 | 2/2008 |

OTHER PUBLICATIONS

Abstract of JP02-080554, p. 1.
English machine translation of JP2000-178713, Industrial Property Digital Library (IPDL) of Japan Patent Office (JPO), pp. 1-11, (Aug. 19, 2010).
English machine translation of JP2000-327319, Industrial Property Digital Library (IPDL) of Japan Patent Office (JPO), pp. 1-29, (Aug. 19, 2010).
English machine translation of JP2001-081563, Industrial Property Digital Library (IPDL) of Japan Patent Office (JPO), pp. 1-7, (Aug. 19, 2010).
English machine translation of JP2008-28125, Industrial Property Digital Library (IPDL) of Japan Patent Office (JPO), pp. 1-13, (Aug. 19, 2010).
Uchida et al., "Experimental Study on Carrier Transport Mechanisms···", IEEE Electron Devices Meeting Technical Digest (2003).
Do Hwan Kim et al., "High-Mobility Organic Transistors Based on Single-···", Advanced Materials, vol. 19, pp. 678-682 (2007).
Lindholm et al., "Rotationally resolved spectra of jet-cooled RuSi", J. Chem. Phys., vol. 127, No. 8, pp. 084317-1-084317-5 (Aug. 28, 2007).
PCT International Search Report of International Application No. PCT/JP2009/053422 (mailed Jun. 2, 2009).
Miyazaki et al., "Ultrathin Layered Semiconductor: Si-Rich Transition Metal Silicide," Japanese Journal of Applied Physics, vol. 46, No. 2, pp. 28-30.
Office Action in Chinese Application No. 200980106376.8, mailed Jun. 19, 2012, with English translation.
Beck, "Photophysical Studies of Bare and Metal-Containing Silicon Clusters," Advances in metal and Semiconductor Clusters, vol. 1, 1993, p. 241-265.
Koyasu et al., "Electronic and Geometric Stabilities of Clusters with Transition Metal Encapsulated by Silicon," J. Phys. Cham. A., vol. 111, on. 1, Dec. 14, 2006, pp. 42-49.
European Search Report, EP Application No. 09714676.5, mailed Dec. 29, 2012, 8 pgs.
European Search Report, EP Application No. 09714676.5, mailed Oct. 29, 2012, 8 pgs.

*Primary Examiner* — Edward Johnson
(74) *Attorney, Agent, or Firm* — Kagan Binder, PLLC

(57) ABSTRACT

The present invention relates to a thin film of a metal-silicon compound and a process for producing the thin film of the metal-silicon compound. The metal-silicon compound is a compound of a transition metal and silicon, and has a transition metal-containing silicon cluster as a unit structure, the transition metal-containing silicon cluster having a structure in which a transition metal atom is surrounded by seven to sixteen silicon atoms, two of which are first and second neighbor atoms to the transition metal atom.

12 Claims, 9 Drawing Sheets

Unit structure $n=7$    $n=8$    $n=9$    $n=10$ $n=11$    $n=12$    $n=13$ $n=14$    $n=15$    $n=16$ $-1.85$ eV $E_{HL} = 0.844$ eV $x=2$  $x=4$
$x=6$  $x=8$
$x=10$  $x=12$ ● H
● Si
● W C11b type structure

THIN FILM OF METAL-SILICON COMPOUND AND PROCESS FOR PRODUCING THE THIN FILM OF THE METAL-SILICON COMPOUND

TECHNICAL FIELD

The present invention relates to a thin film of a metal-silicon compound used as a semiconductor thin film of a thin film transistor and the like, and a process for producing the thin film of the metal-silicon compound.

BACKGROUND ART

Films made from crystalline silicon and amorphous silicon can be made with ultrathin thicknesses. Actually, it has been reported that a crystalline silicon layer can be formed with an average thickness of 0.7 nm by thermal oxidation of a SOI (Silicon on Insulator) substrate (see Non-Patent Literature 1). However, in such a thin film, it is difficult to control an interfacial structure thereof in an atomic layer level, whereby an interface state such as a defect or the like is caused in the thin film. Further, due to the ultrathin thickness of the ultrathin conducting layer, the interface state causes carrier scattering, thereby affecting conductivity in the ultrathin conducting layer. Actual mobility of electrons in the crystalline silicon having 0.7 nm in thickness is 50 $cm^2/Vsec$. This is extremely inferior to 1000 $cm^2/Vsec$ or less that is mobility of bulk crystalline silicon. Furthermore, in such a thin film structure, conductive control by doping cannot be performed because a so-called dopant itself, such as phosphorus and boron, causes carrier scattering.

Amorphous silicon is a semiconducting material used for a TFT of liquid crystal, a solar cell and the like. However, the amorphous silicon has lower mobility than crystalline silicon whose mobility is 1 $cm^2/Vsec$ for n-type semiconductor and the mobility of the crystalline silicon is 0.1 $cm^2/Vsec$ for p-type semiconductor. Therefore, the amorphous silicon cannot be used for a material for a high-performance device such as a LSI. Further, the amorphous silicon requires a hydrogenation of dangling bond so as to retain properties as a semiconducting material. However, it has been known that, because the end of the dangling bond is dehydrogenated by hot electron or photoirradiation, a device having the amorphous silicon falls into out of order.

There has been known that organic materials, such as a pentacene, encompass a material having mobility higher than the amorphous silicon. The material has been regarded as a potential material for organic devices such as an electroluminescence, a field effect transistor and a solar cell (see Non-Patent Literature 2).

However, electron field-effect mobility of electron holes of p-type pentacene is no more than 0.75 $cm^2/Vsec$ (see Non-Patent Literature 3). Therefore, the electron field-effect mobility of the electron holes of the p-type pentacene is inferior to the mobility of the crystalline silicon. As a result, the p-type pentacene cannot be a material for the high-performance device. Further, the p-type pentacene has lower heat resistance and oxidation resistance than those of silicon materials. The p-type pentacene is also inferior in stable performance. Particularly, the p-type pentacene has a melting point of substantially 300° C., and therefore, cannot be used for a device that would reach a high temperature.

A patent (see Patent Literature 1) discloses a cluster compound of a transition metal and silicon. However, the patent does not disclose an array of the cluster compound.

Another patent (see Patent Literature 2) discloses that a semiconductor is made of a laminated substance in which a transition metal-containing silicon cluster having a $MSi_{12}$ composition is arranged. This patent also discloses a semiconductor device that uses the laminated substance. However, the semiconductor device is not sufficiently functional because the laminated substance has a narrow band gap.

Paten Literature 1
Japanese Patent Application Publication, Tokukai, No. 2000-327319 A
Patent Literature 2
Japanese Patent Application Publication, Tokukai, No. 2008-28125 A
Non-Patent Literature 1
IEEE International Electron Devices Meeting 2003 Technical Digest, p 805
Non-Patent Literature 2
Journal of the Physical Society of Japan 2007, vol. Nov., p 851
Non-Patent Literature 3
Advanced Materials 2007, vol. 19, p 678

SUMMARY OF INVENTION

Technical Problem

An object of the present invention is to provide a thin film of a metal-silicon compound in which a gap $E_{HL}$ between highest occupied molecular orbital (HOMO) and lowest unoccupied molecular orbital (LUMO) is wide, and to provide a process for producing the thin film of the metal-silicon compound.

Solution to Problem

In order to attain the foregoing object, the present invention provides the followings.

(1) A thin film of a metal-silicon compound, the metal-silicon compound being a compound of a transition metal and silicon, in which compound a unit structure is a transition metal-containing silicon cluster, the transition metal-containing silicon cluster having a structure in which a transition metal atom is surrounded by seven to sixteen silicon atoms, two of which are first and second neighbor atoms to the transition metal atom.

(2) The thin film of the metal-silicon compound as set forth in (1) wherein: the transition metal atom is any one of titanium, vanadium, chromium, manganese, iron, cobalt, nickel, zirconium, niobium, molybdenum, ruthenium, rhodium, hafnium, tantalum, tungsten, rhenium, osmium and iridium.

(3) The thin film of the metal-silicon compound as set forth in (2) wherein: the transition metal atom is molybdenum or tungsten, and the number of silicon atoms is ten or twelve in the unit structure.

(4) A thin film of a hydrogenated metal-silicon compound, being made by hydrogenating a transition metal-containing silicon cluster as set forth in (1) or (2).

(5) A process for producing a thin film of a metal-silicon compound as set forth in any one of (1) to (3), comprising the steps of: synthesizing in advance a transition metal-containing silicon cluster in which the transition metal atom is surrounded by four to sixteen silicon atoms; and agglomerating the synthesized transition metal-containing silicon cluster.

(6) A process for producing a thin film of a metal-silicon compound as set forth in any one of (1) to (3), comprising the step of: emitting the transition metal atom into monosilane gas by laser ablation method, so as to synthesize the transition metal-containing silicon cluster by gas phase reaction of the transition metal atom with monosilane.

(7) A process for producing a thin film of a metal-silicon compound as set forth in any one of (1) to (3), comprising the step of: emitting the transition metal atom and a silicon atom from a compound target of the transition metal atom and silicon by laser ablation method, so as to synthesize the transition metal-containing silicon cluster.

(8) A process for producing a thin film of a metal-silicon compound as set forth in any one of (1) to (3), comprising the steps of: depositing the transition metal-containing silicon cluster on a surface of a solid substrate; and reacting the deposited transition metal-containing silicon cluster with monosilane, so as to form a structure in which the transition metal atom is surrounded by seven to sixteen silicon atoms.

(9) A process for producing a thin film of a hydrogenated metal-silicon compound as set forth in (4), comprising the steps of: synthesizing in advance a hydrogenated transition metal-containing silicon cluster in which the transition metal atom is surrounded by four to sixteen silicon atoms; and agglomerating the synthesized hydrogenated transition metal-containing silicon cluster.

(10) A process for producing a thin film of a hydrogenated metal-silicon compound as set forth in (4), comprising the step of: emitting the transition metal atom into monosilane gas by laser ablation method, so as to synthesize the hydrogenated transition metal-containing silicon cluster by gas phase reaction of the transition metal atom with mono silane.

(11) A process for producing a thin film of a hydrogenated metal-silicon compound as set forth in (4), comprising the step of: emitting the transition metal atom and a silicon atom into monosilane gas from a compound target of the transition metal atom and silicon by laser ablation method, so as to synthesize the hydrogenated transition metal-containing silicon cluster by gas phase reaction of the transition metal atom with monosilane.

(12) A process for producing a thin film of a hydrogenated metal-silicon compound as set forth in (4), comprising the steps of: depositing the hydrogenated transition metal-containing silicon cluster on a surface of a solid substrate; and reacting the deposited hydrogenated transition metal-containing silicon cluster with monosilane, so as to form a structure in which the transition metal atom is surrounded by seven to sixteen silicon atoms.

Advantageous Effects of Invention

The present invention makes it possible to produce a semiconductor film having a finite band gap by agglomerating a transition metal-containing silicon cluster because the transition metal-containing silicon cluster is a semiconductor in which a gap $E_{HL}$ between highest occupied molecular orbital (HOMO) and lowest unoccupied molecular orbital (LUMO) is wide.

Particularly, in a case where a transition metal M is Mo or W, and in a case where a transition metal-containing silicon cluster in which the number of silicon atoms is ten or twelve is deposited, the band gap of the semiconductor film exceeds 0.8 eV that is a value necessary for an operation of a transistor in room temperature.

When the number of valence electrons of a contained transition metal M is odd, the total number of valence electrons of a transition metal-containing silicon cluster becomes odd (odd electron). Therefore, strictly speaking, $E_{HL}$ becomes 0 eV. However, agglomeration of the transition metal-containing silicon cluster forms bonding between clusters. Further, interchange of an electric charge causes structural relaxation, thereby allowing formation of a semiconductor film, as in a case where the transition metal-containing silicon cluster having even electrons is agglomerated. That is, the semiconductor film is formed by agglomerating a transition metal-containing silicon cluster in which a gap $E_{SL}$, instead of $E_{HL}$, between semi-unoccupied molecular orbital (SUMO) and LUMO is wide.

DESCRIPTION OF EMBODIMENTS

The following schematically describes a thin film of a metal-silicon compound of the present invention.

Figure 17:
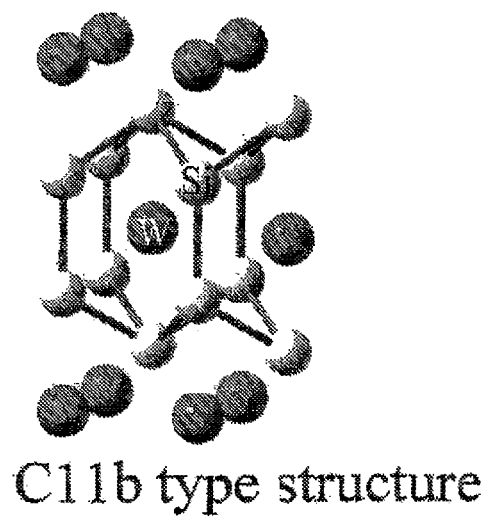
FIG. 17 shows a C11b type crystalline structure of $WSi_2$.

No silicon cluster that contains a transition metal exists in a metal silicide $MSi_2$. For example, in a $MSi_2$ crystalline structure (C11b type) as shown in FIG. 17, ten Si atoms are disposed around a W atom, and further other W atoms are disposed around the ten Si atoms. That is, in the $MSi_2$ crystalline structure, ten Si atoms are shared by a plurality of W atoms, Si atoms are first neighbor atoms to the W atom, and the other W atoms are second neighbor atoms to the W atom.

Figure 1:
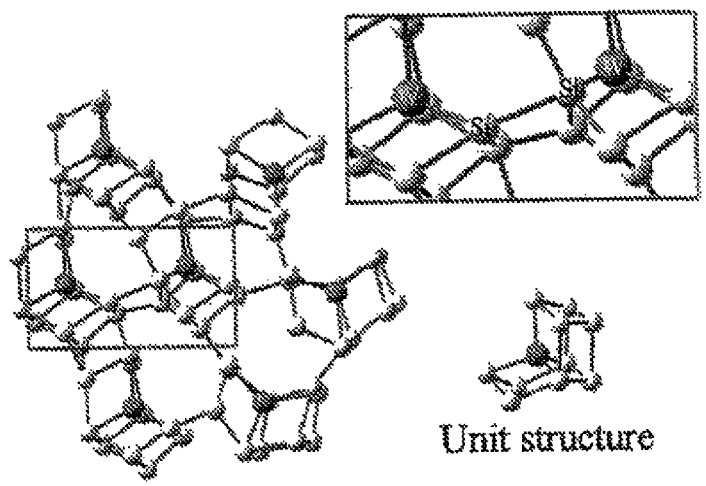
FIG. 1 shows a $WSi_{10}$ film in which $WSi_{10}$ of the present invention is a unit structure.

On the contrary, the thin film of the metal-silicon compound (hereinafter referred to as a "$MSi_n$ film" in this specification) of the present invention is characterized in that silicon atoms in a transition metal-containing silicon cluster (hereinafter referred to as "$MSi_n$" in this specification) is bonded to silicon atoms in another transition metal-containing silicon cluster, thereby causing silicon atoms to become second neighbor atoms to a transition metal M (hereinafter referred to as "M" in this specification). FIG. 1 shows a structure of a WSi$_{10}$ film. As shown in an enlarged view of FIG. 1, the WSi$_{10}$ film has a structure in which a W—Si—Si—W network is formed. The structure makes it possible to form a semiconductor thin film having the foregoing function.

FIG. 17 shows the bonding between silicon atoms so as to highlight ten Si atoms around a W atom. An upper right diagram of FIG. 1 shows an enlarged view of a portion that is surrounded by a line of a left diagram of FIG. 1, and a lower right diagram of FIG. 1 shows a WSi$_{10}$ cluster used as a unit structure.

Further, hydrogenation of the MSi$_n$ film widens a band gap thereof, and causes the MSi$_n$ film to have high resistance. Furthermore, because the MSi$_n$ film has a silicon cluster that contains M as a unit structure, a dangling bond of the silicon atoms is ended at the M that is disposed inside the silicon atoms. Therefore, the MSi$_n$ film does not require a hydrogenation of dangling bond in order to form a finite band gap though amorphous silicon requires it. As a result, the MSi$_n$ film is not so deteriorated in its function by dehydrogenation.

A thin film in which MSi$_n$ is deposited is macroscopically amorphous. However, the thin film has a structure locally uniformed by having MSi$_n$ ("n" is a number ranging from 7 to 16) as a unit structure. Further, properties of a cluster that is a unit structure promise that an electronic state of the thin film is semiconducting, and the MSi$_n$ film is characteristic of having carrier mobility higher than that of amorphous silicon. Actually, MoSi$_9$ and MoSi$_{12}$ films are p-type and have 6.9 cm$^2$/Vsec and 32.4 cm$^2$/Vsec of mobility, respectively. Accordingly, a film in which a silicon cluster that contains M is a unit structure can be substituted for amorphous silicon in order to form a transistor of higher performance. It can be said that the film has mobility higher than that of a thin film of an organic semiconductor. Pentacene is known as an organic conductor material having high mobility. However, electron field-effect mobility of electron holes of p-type pentacene is no more than 0.75 cm$^2$/Vsec. The thin film of the organic semiconductor is characteristic of being formed in low temperature and forming a transistor on various solid substrates. A MSi$_n$ film also can be deposited in room temperature, and can be formed on various solid substrates.

The following describes, in detail, the thin film of the metal-silicon compound of the present invention and a process for producing the thin film of the meta-silicon compound, with reference to drawings.

First, a transition metal-containing silicon cluster is searched by first-principles calculation.

A structure search by the first-principles calculation was conducted for a metal-silicon cluster having a composition in which a M atom has seven Si atoms. As a result, it was found that, when the transition metal M is titanium (Ti), vanadium (V), chromium (Cr), manganese (Mn), iron (Fe), cobalt (Co), nickel (Ni), zirconium (Zr), niobium (Nb), molybdenum (Mo), ruthenium (Ru), rhodium (Rh), hafnium (Hf), tantalum (Ta), tungsten (W), rhenium (Re), osmium (Os) or iridium (Ir), structures shown in FIG. 2 or other structures similar to those shown in FIG. 2 are stable, in which structures the M atom is surrounded by the silicon atoms.

Figure 2:
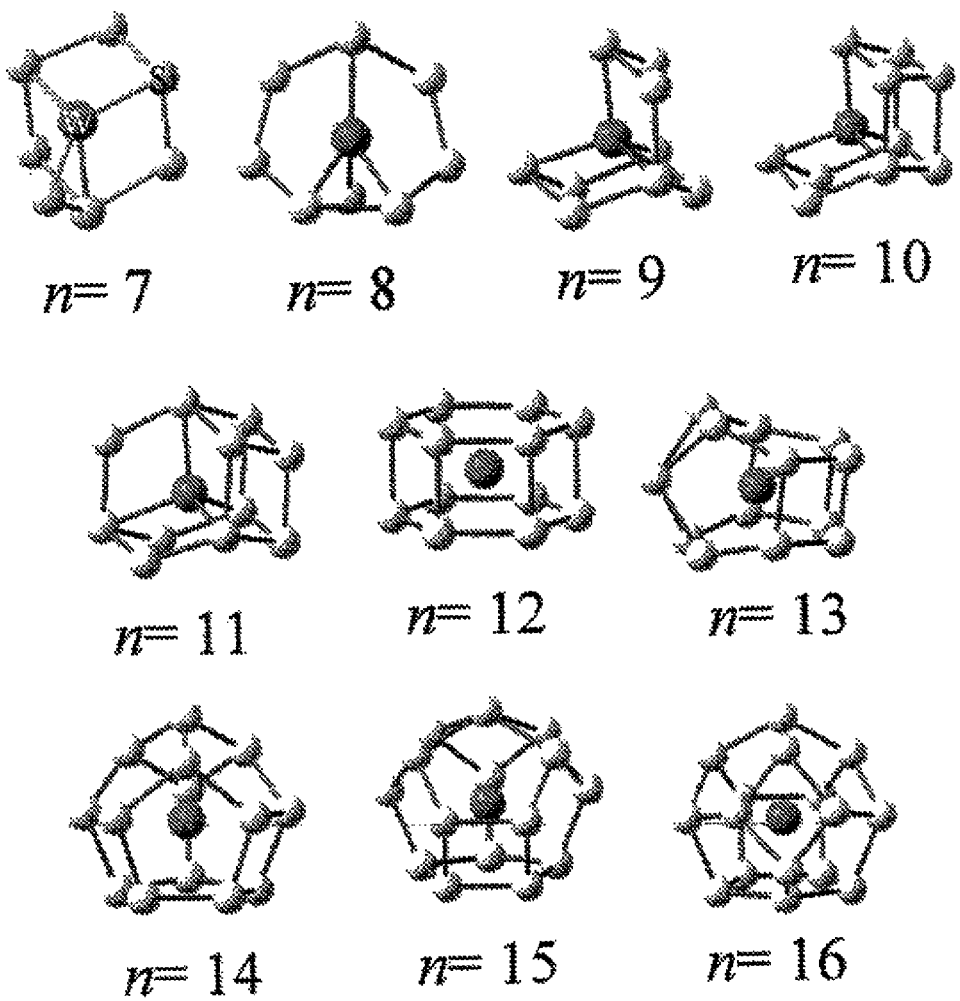
FIG. 2 shows a stable structure of $MSi_n$ ("n" is a number in a range of 7 to 16), obtained by first-principles calculation.

FIG. 2 shows a stable structure of MSi$_n$ ("n" ranges from 7 to 16), obtained by the first-principles calculation. In FIG. 2, M=W. Even in a case where the M is Ti, V, Cr, Mn, Fe, Co, Ni, Cu, Zr, Nb, Mo, Ru, Rh, Pd, Ag, Hf, Ta, Re, Os, Ir, Pt or Au, the MSi$_n$ has a structure similar to those shown in FIG. 2. Gaussian03 was used for this calculation. Chemical models used for this calculation were B3LYP/LanL2DZ and B3PW91/LanL2DZ.

FIG. 2 shows structures wherein M may be W. As shown in Table 1, a gap E$_{HL}$ between HOMO and LUMO and a gap E$_{SL}$ between SUMO and LUMO of the cluster range from 0.71 eV to 2.99 eV.

Figure 3:
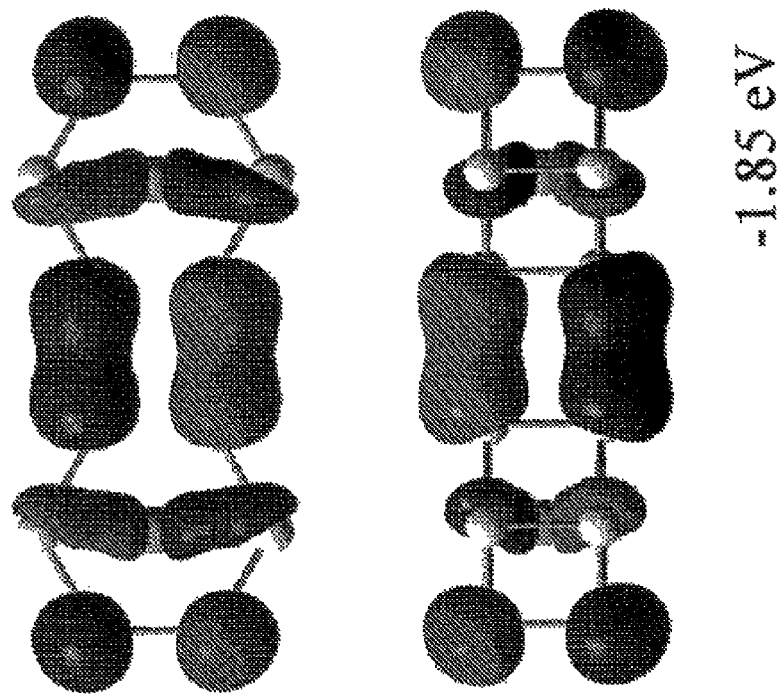
FIG. 3 shows a stable structure of a $NbSi_{12}$ dimer, obtained by first-principles calculation, and shows a molecular orbital representing existence of bonding between $NbSi_{12}$.
Figure 3:
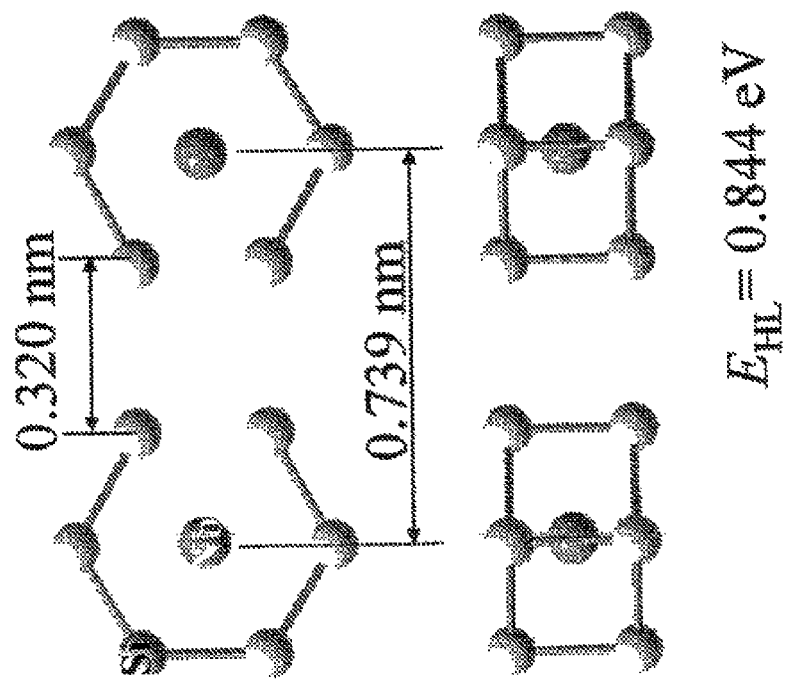

The following describes that a semiconductor film can be formed by agglomerating a transition metal-containing silicon cluster in which E$_{SL}$ is wide and which has odd electrons. FIG. 3 shows a stable structure obtained by the first-principles calculation, and shows a molecular orbital representing bonding between NbSi$_{12}$, in a case where two of NbSi$_{12}$ in which E$_{SL}$ is 1.06 eV are bonded to each other, that is, in a case where a dimmer is formed. The NbSi$_{12}$ stabilized when a distance between bonded silicon atoms that are closest to each other was 0.32 nm. When a molecular orbital whose level is 1.85 eV lower than energy of HOMO having even electrons made of a NbSi$_{12}$ dimer, is observed, it is apparent that the NbSi$_{12}$ molecules show an amplitude due to bonding, thereby proving that bonding between clusters is formed in the NbSi$_{12}$ molecules. The bond formation between the NbSi$_{12}$ molecules is associated with charge transfer, thereby causing structural relaxation in which a distance between bonded silicon atoms of a part of six-membered Si ring of NbSi$_{12}$ increases. In the structural relaxation, the electrons made of the NbSi$_{12}$ dimer have a gap E$_{HL}$ that is 0.844 eV and semiconducting properties. Similarly, gaps E$_{HL}$ of stable structures of other MSi$_{12}$ having odd electrons were determined as follows: E$_{HL}$ was 0.844 eV in a case of a TaSi$_{12}$ dimer; E$_{HL}$ was 0.381 eV in a case of a ReSi$_{12}$ dimer; E$_{HL}$ was 0.816 eV in a case of a VSi$_{12}$ dimer; and E$_{HL}$ was 0.354 eV in a case of a MnSi$_{12}$ dimer. Further, gaps E$_{HL}$ of stable structures of dimers of MSi$_n$ having odd electrons and having a different silicon composition were determined as follows: E$_{HL}$ was 2.50 eV in a case of NbSi$_7$; and E$_{HL}$ was 1.61 eV in a case of ReSi$_{10}$. As a result, it was found that these stable structures have semiconducting properties.

Figure 4:
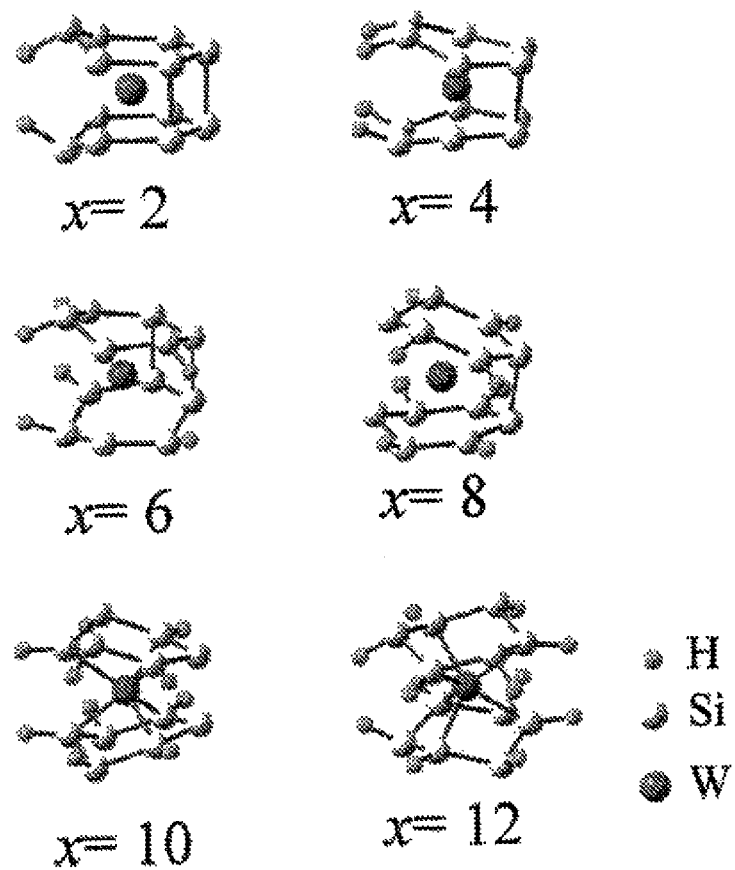
FIG. 4 shows a change of a stable structure, caused by hydrogenating $WSi_{12}$ into $WSi_{12}H_x$.

FIG. 4 shows a structure of a hydrogenated transition metal-containing silicon cluster (hereinafter referred to as "MSi$_n$H$_x$" in this specification, and note that "x" ranges from 2 to 12), figured by first-principles calculation. From FIG. 4, it is apparent that, even if the transition metal-containing silicon cluster is hydrogenated, the transition metal-containing silicon cluster retains, by W–Si bonding, a structure in which a W atom is surrounded by Si atoms. This proves that, as long as the M-Si bonding is retained, the hydrogenation of MSi$_n$ ("n" ranges from 7 to 16) having a silicon cluster structure, even if it occurs, will not deprive a transition metal-containing silicon cluster of the structure in which a M atom is surrounded by Si atoms. Based on this, it can be deduced that the number "x" of hydrogen atoms that can bond to MSi$_n$ ranges from 1 to "n".

TABLE 1

| TiSi$_n$ | | CoSi$_n$ | | NiSi$_n$ | | MoSi$_n$ | | HfSi$_n$ | | ReSi$_n$ | |
| --- | --- | --- | --- | --- | --- | --- | --- | --- | --- | --- | --- |
| n | E$_{HL}$ (eV) | n | E$_{SL}$ (eV) | n | E$_{HL}$ (eV) | n | E$_{HL}$ (eV) | n | E$_{HL}$ (eV) | n | E$_{SL}$ (eV) |
| 7 | 1.85 | 7 | 2.94 | 7 | 2.88 | 7 | 2.50 | 7 | 1.96 | 7 | 1.99 |
| 8 | 1.90 | 8 | 1.50 | 8 | 1.58 | 8 | 2.56 | 8 | 1.90 | 8 | 1.44 |
| 9 | 1.42 | 9 | 2.37 | 9 | 1.93 | 9 | 2.80 | 9 | 1.88 | 9 | 1.39 |
| 10 | 1.50 | 10 | 1.17 | 10 | 1.03 | 10 | 1.61 | 10 | 1.42 | 10 | 1.25 |
| 11 | 1.66 | 11 | 1.20 | 11 | 1.42 | 11 | 2.26 | 11 | 1.63 | 11 | 1.33 |

TABLE 1-continued

| 12 | 1.71 | 12 | 1.80 | 12 | 1.09 | 12 | 2.20 | 12 | 1.74 | 12 | 2.99 |
| 13 | 1.80 | 13 | 1.39 | 13 | 1.25 | 13 | 2.48 | 13 | 1.66 | 13 | 1.22 |
| 14 | 0.90 | 14 | 1.69 | 14 | 1.63 | 14 | 1.58 | 14 | 0.82 | 14 | 1.01 |
| 15 | 1.50 | 15 | 1.55 | 15 | 1.58 | 15 | 1.50 | 15 | 1.33 | 15 | 1.20 |
| 16 | 2.12 | 16 | 1.03 | 16 | 1.88 | 16 | 1.74 | 16 | 2.12 | 16 | 1.28 |

| $VSi_n$ | | $MnSi_n$ | | $ZrSi_n$ | | $RuSi_n$ | | $TaSi_n$ | | $OsSi_n$ | |
|---|---|---|---|---|---|---|---|---|---|---|---|
| n | $E_{SL}$ (eV) | n | $E_{SL}$ (eV) | n | $E_{HL}$ (eV) | n | $E_{HL}$ (eV) | n | $E_{SL}$ (eV) | n | $E_{HL}$ (eV) |
| 7 | 1.93 | 7 | 1.74 | 7 | 1.93 | 7 | 1.69 | 7 | 1.66 | 7 | 1.69 |
| 8 | 1.88 | 8 | 1.17 | 8 | 1.88 | 8 | 1.58 | 8 | 1.55 | 8 | 1.85 |
| 9 | 1.93 | 9 | 1.90 | 9 | 1.25 | 9 | 1.88 | 9 | 1.63 | 9 | 2.12 |
| 10 | 1.50 | 10 | 1.58 | 10 | 1.42 | 10 | 1.63 | 10 | 1.36 | 10 | 1.63 |
| 11 | 1.44 | 11 | 1.55 | 11 | 1.66 | 11 | 1.96 | 11 | 1.39 | 11 | 1.99 |
| 12 | 1.01 | 12 | 2.99 | 12 | 1.69 | 12 | 2.80 | 12 | 1.06 | 12 | 2.53 |
| 13 | 1.96 | 13 | 1.74 | 13 | 1.80 | 13 | 1.85 | 13 | 1.44 | 13 | 1.88 |
| 14 | 1.12 | 14 | 1.44 | 14 | 0.90 | 14 | 0.93 | 14 | 1.06 | 14 | 0.90 |
| 15 | 1.50 | 15 | 1.25 | 15 | 1.50 | 15 | 1.44 | 15 | 1.59 | 15 | 1.44 |
| 16 | 1.69 | 16 | 1.22 | 16 | 2.12 | 16 | 0.95 | 16 | 1.58 | 16 | 1.03 |

| $CrSi_n$ | | $FeSi_n$ | | $NbSi_n$ | | $RhSi_n$ | | $WSi_n$ | | $IrSi_n$ | |
|---|---|---|---|---|---|---|---|---|---|---|---|
| n | $E_{HL}$ (eV) | n | $E_{HL}$ (eV) | n | $E_{SL}$ (eV) | n | $E_{SL}$ (eV) | n | $E_{HL}$ (eV) | n | $E_{SL}$ (eV) |
| 7 | 2.34 | 7 | 1.71 | 7 | 1.66 | 7 | 1.47 | 7 | 2.34 | 7 | 1.58 |
| 8 | 2.67 | 8 | 2.26 | 8 | 1.55 | 8 | 1.39 | 8 | 2.75 | 8 | 1.39 |
| 9 | 2.67 | 9 | 1.71 | 9 | 1.61 | 9 | 1.39 | 9 | 2.12 | 9 | 1.33 |
| 10 | 1.63 | 10 | 1.39 | 10 | 1.36 | 10 | 1.25 | 10 | 1.50 | 10 | 1.28 |
| 11 | 2.23 | 11 | 1.90 | 11 | 1.39 | 11 | 1.42 | 11 | 2.23 | 11 | 1.33 |
| 12 | 2.28 | 12 | 2.80 | 12 | 1.06 | 12 | 1.12 | 12 | 2.61 | 12 | 0.71 |
| 13 | 2.34 | 13 | 1.77 | 13 | 1.44 | 13 | 1.39 | 13 | 2.48 | 13 | 1.39 |
| 14 | 1.55 | 14 | 1.63 | 14 | 1.09 | 14 | 1.28 | 14 | 1.55 | 14 | 1.06 |
| 15 | 1.52 | 15 | 1.39 | 15 | 1.52 | 15 | 1.20 | 15 | 1.47 | 15 | 1.20 |
| 16 | 1.74 | 16 | 0.79 | 16 | 1.55 | 16 | 1.01 | 16 | 1.77 | 16 | 1.03 |

The following describes, in detail, a process for producing a thin film of a metal-silicon compound of the present invention.

Figure 5:
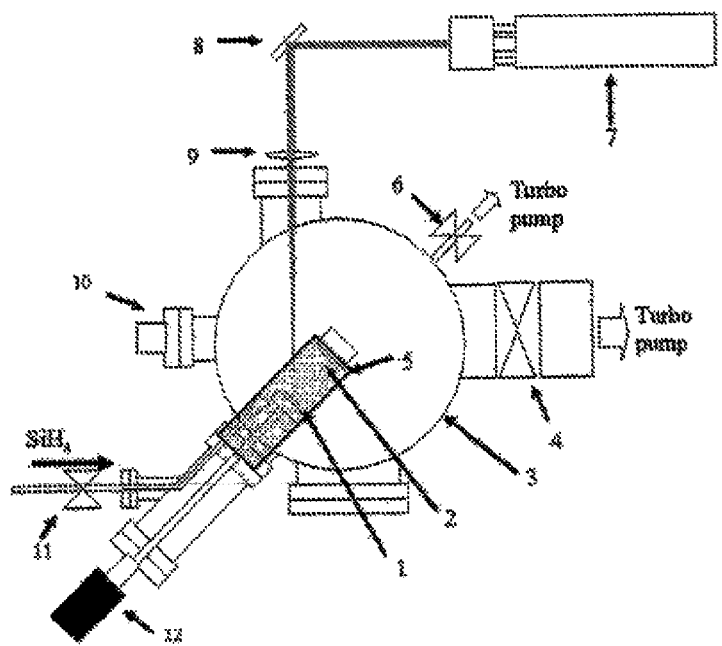
FIG. 5 is a plan view of $MSi_n$ cluster deposition system.

Laser ablation is performed on a transition metal M in $SiH_4$ atmosphere, thereby causing gas phase reaction of $SiH_4$ with a M atom so as to form $MSi_nH_x$. Then, the formed $MSi_nH_x$ is deposited on a surface of a solid substrate, thereby forming a film in which $MSi_nH_x$ and $MSi_n$ clusters are agglomerated. FIG. 5 shows a basic structure of a device.

In FIG. 5, a reference sign 1 represents a transition metal target, a reference sign 2 represents a sample substrate and a holder, a reference sign 3 represents a vacuum chamber, a reference sign 4 represents a gate valve, a reference sign 5 represents a quartz cluster growing pipe, a reference sign 6 represents a bypass line and a leak valve, a reference sign 7 represents a Nd:YAG laser (wavelength: 532 nm, repetition frequency: 20 Hz, pulse width: 7 ns, and 1 W), a reference sign 8 represents a multilayer mirror, a reference 9 represents a plane-convex lens, a reference sign 10 represents a vacuum gauge, a reference sign 11 represents a variable leak valve, and a reference sign 12 represents a rotating motor.

The process for producing the thin film of the metal-silicon compound is as described below.

(1) A sample substrate is positioned in a holder, and a transition metal target is positioned in a rotating holder.

(2) A vacuum chamber is vacuated substantially to $2.0 \times 10^{-7}$ Pa by a turbo-molecular pump, and a gate valve is then closed. Then, the vacuuming is switched to connection to a bypass line.

(3) 0.1 Pa to 30 Pa of $SiH_4$ is introduced into the vacuum chamber through a leak valve.

(4) The transition metal target is adjusted to be positioned at a focus of a plane-convex lens, and the transition metal target is irradiated by a Nd:YAG laser. Power of the Nd:YAG laser ranges from 0.25 W to 0.3 W, a pulse width of the laser is 7 ns, and repetition frequency of the pulse is 20 Hz. On the sample substrate that faces the transition metal target, $MSi_nH_x$ is deposited. The deposited film of $MSi_nH_x$ on the sample substrate is $10 \times 10$ mm² in dimension and 10 nm to 40 nm in thickness.

(5) The deposited film of $MSi_nH_x$ is annealed at 300° C. to 500° C. under ultra high vacuum, thereby dehydrogenating the $MSi_nH_x$ film. This forms a $MSi_n$ film.

The process for producing the thin film of the metal-silicon compound on a surface of a solid substrate is as described below.

By performing (1) to (4) similar to those described above, $MSi_nH_x$ in which a transition metal atom M is surrounded by four to sixteen silicon atoms is deposited on the surface of the solid substrate.

Thereafter, (5) the deposited $MSi_nH_x$ is exposed to 0.1 Pa to 10 Pa of $SiH_4$. At the time of exposure, a temperature on a surface of a sample substrate is controlled in the range from room temperature to 400° C., and the deposited $MSi_nH_x$ is reacted to the $SiH_4$. This forms a structure in which the transition metal atom M is surrounded by seven to sixteen silicon atoms.

(6) The $MSi_nH_x$ is annealed at 300° C. to 500° C. under ultra high vacuum, thereby dehydrogenating $MSi_nH_x$. This forms a $MSi_n$ film.

In the process for producing the thin film of the metal-silicon compound, the target used for laser ablation is a transition metal target. However, a compound target of metal atoms and silicon may be used. That is, from the compound target of the metal atoms and the silicon, the transition metal atoms and silicon atoms are emitted by laser ablation method, and thereby the transition metal-containing silicon cluster is synthesized.

Similarly, the transition metal atoms and the silicon atoms may be emitted into monosilane gas from the compound target of the transition metal atoms and the silicon by laser ablation method, so as to react the transition metal atoms with monosilane in the gas phase. This synthesizes a hydrogenated transition metal-containing silicon cluster.

As compared to the transition metal target, this process in which the compound target is used, especially in a case where the compound target is made of high-melting metal, can achieve a higher deposition rate than the use of the transition metal target, and more saves monosilane gas than the use of the transition metal target because a film of high silicon content can be easily formed.

The following describes a composition of a $MSi_n$ film and a result of structural analysis of the $MSi_n$ film, obtained by X-ray photoelectron spectroscopy.

$MoSi_n$ and $NbSi_n$ films having various composition ratios "n" of Si to M are synthesized by adjusting pressure and flow rate of $SiH_4$, and ablation conditions for M, such as laser intensity.

Figure 6:
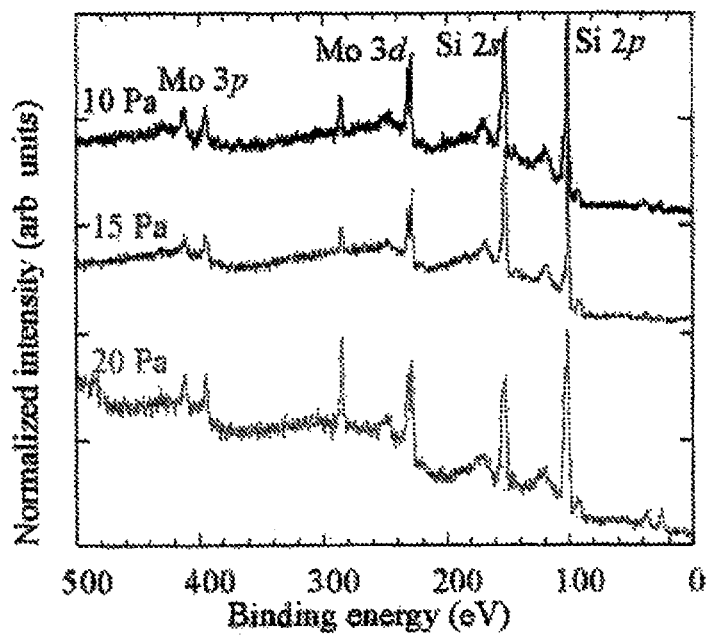
FIG. 6 shows XPS spectrum of a $MoSi_n$ film.

FIG. 6 shows X-ray photoelectron spectroscopy (XPS) spectrum of MoSin. Concretely, FIG. 6 shows XPS spectrum in a case where ablation was performed on Mo by 0.3 W of Nd:YAG pulse laser (wavelength: 532 nm, repetition frequency: 20 Hz, and pulse width: 7 ns), and where pressure of SiH4 atmosphere was 10 Pa, 15 Pa or 20 Pa. In FIG. 6, peaks of Mo 3p and Mo 3d and peaks of Si 2s and Si 2p were found. The peak intensity ratio of the Mo 3p to the Si 2p reflects a composition ratio of M to Si.

Figure 7:
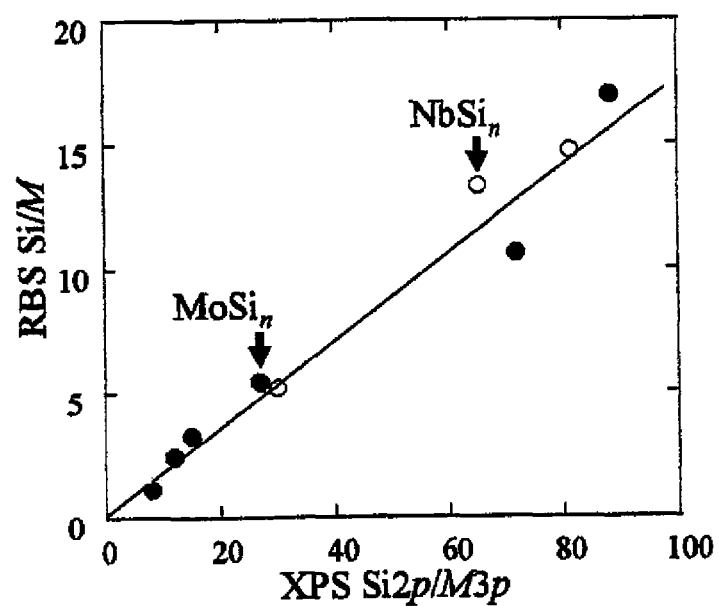
FIG. 7 shows a plot of $MoSi_n$ and $NbSi_n$ film compositions in RBS spectrum against relative intensity of each of Si 2p peak and Mo 3p peak in the XPS spectrum.

FIG. 7 shows a plot of MoSin and NbSin film compositions in RBS spectrum against relative intensity of each peak of Si 2p and Mo 3p in XPS spectrum. Actually, as shown in FIG. 7, in the plot of ratio of Si to M calculated from Rutherford backscattering spectrometry (RBS) spectrum against ratio of Si to M calculated from XPS of the $MoSi_n$ and $NbSi_n$ films, the $MoSi_n$ and $NbSi_n$ films are substantially in proportion to each other. As a result, it is apparent that control of the pressure of $SiH_4$ atmosphere or the like enabled formation of the $MoSi_n$ and $NbSi_n$ films having different compositions.

As described above, when "n" of $MSi_n$ is seven or more, $MSi_n$ has a structure in which a M atom is surrounded by Si atoms. Generally, a transition metal element has high reactivity with oxygen and water. Therefore, when the transition metal element is exposed to the air, the transition metal element is oxidized. However, in a material in which a cluster is a unit structure, M is surrounded by a network of Si, thereby suppressing oxidization of M. In order to confirm that the $MSi_n$ film has the structure in which M is surrounded by the network of Si, XPS spectrum of the $MSi_n$ film was measured after the $MSi_n$ film was exposed to the air.

Figure 8:
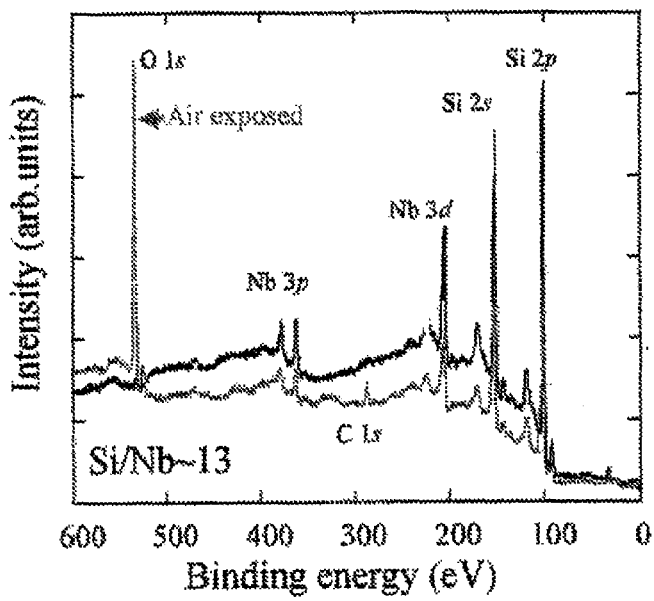
FIG. 8 shows XPS spectrum of a $NbSi_{13}$ film before and after exposure to the air.
Figure 9:
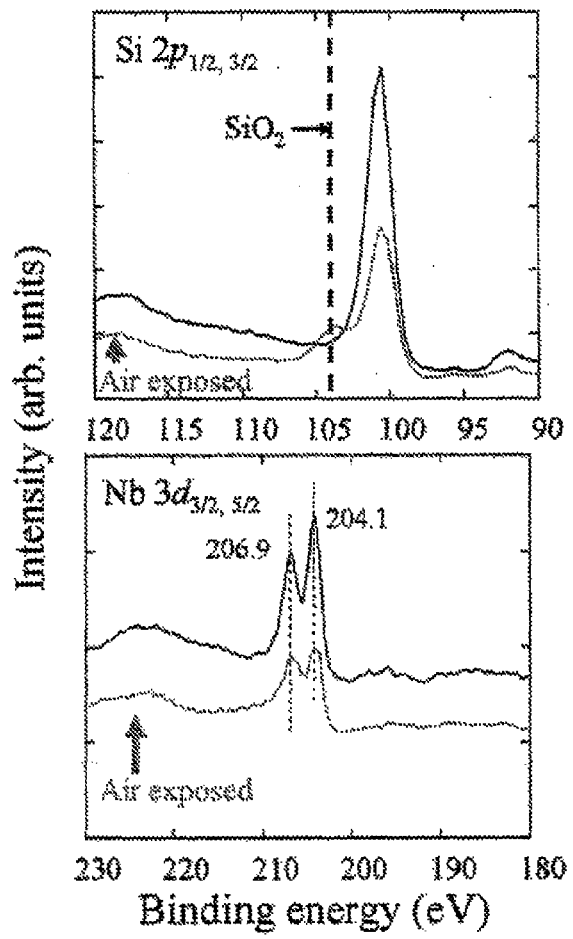
FIG. 9 shows detailed spectrum around Si2p and Nb3d in XPS spectrum of a $NbSi_{13}$ film before and after exposure to the air.

FIG. 8 shows XPS spectrum of a $NbSi_{13}$ film before and after exposure to the air. As a result of the exposure of the $NbSi_{13}$ film to the air, a peak of O 1s was detected. At the time of detection, peaks of Si 2p and Nb 3d were examined in detail (FIG. 9). In the examination, 104 eV of peak in which a signal of the Si 2p indicates formation of $SiO_2$ was detected after exposure to the air. Meanwhile, it was found that the peak of the Nb 3d hardly changed before and after exposure to the air, and that Nb was not oxidized. As a result, it was found that the $NbSi_{13}$ film has a structure in which Nb is surrounded by a network of Si.

The following describes a measurement result of resistivity of a $MSi_n$ film.

Figure 10:
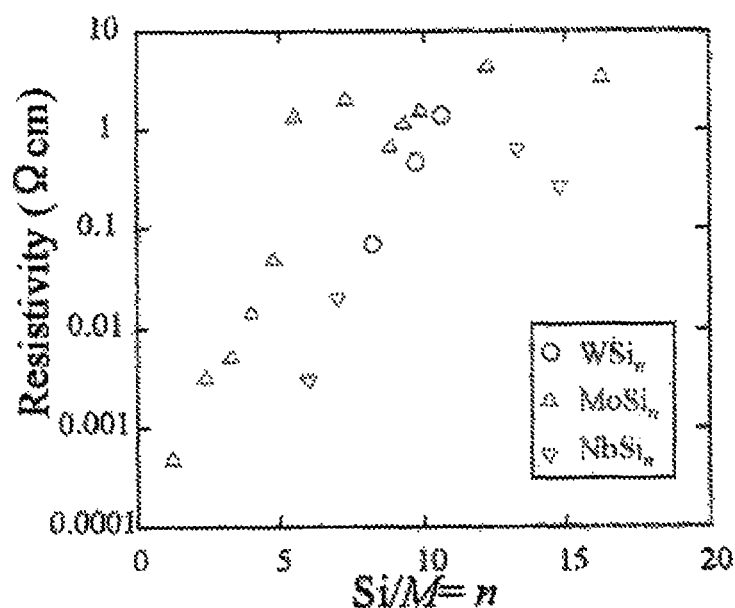
FIG. 10 shows a change of resistivity of each of $WSi_n$, $MoSi_n$ and $NbSi_n$ films, plotted against Si/M=n.

FIG. 10 shows a change of resistivity of each of $WSi_n$, $MoSi_n$ and $NbSi_n$ films, plotted against Si/M=n. Composition ratio "n" of Si to M was calculated by Rutherford backscattering spectrometry and X-ray photoelectron spectroscopy. The resistivity was obtained from a result of four-terminal electric conductivity measurement.

FIG. 10 plots resistivity of each of the $WSi_n$, $MoSi_n$ and $NbSi_n$ films against the composition ratio "n". As n=Si/M increases, the resistivity grows exponentially. Particularly, the resistivity of the $MoSi_n$ exceeds 1 Ωcm in a region where n>5. This indicates that metal electric conductivity is shifted toward semiconducting conductivity as the number of "n" increases. Further, when the $NbSi_n$ film is compared to the $MoSi_n$ film, the resistivity of the $NbSi_n$ film is substantially one or two digits lower than that of the $MoSi_n$ film even if the $NbSi_n$ film and the $MoSi_n$ film have an identical Si/M composition. This indicates that physicality of the $MSi_n$ film is controllable depending on types of a transition metal-containing unit structure cluster.

Figure 11:
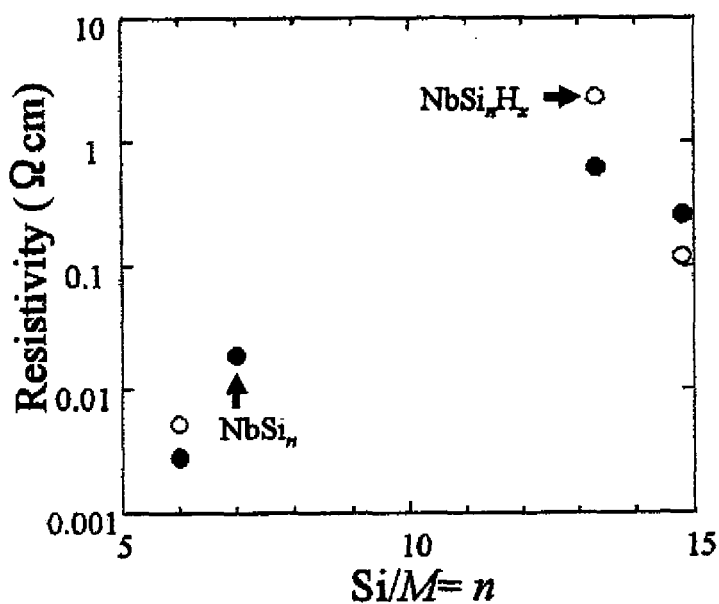
FIG. 11 shows a change of resistivity plotted against "n" before and after a $NbSi_nH_x$ film is heated at 500° C.

FIG. 11 shows a change of resistivity before and after a deposited $NbSi_nH_x$ is heated at 500° C. The $NbSi_nH_x$ is dehydrogenated by heat treatment. This causes a change of resistivity of the $NbSi_nH_x$. However, the $NbSi_nH_x$ film becomes a semiconductor film along with an increase of the number of "n".

In FIG. 11, pre-heat treatment is represented as a white circle, and after-heat treatment is represented as a black circle. The heat treatment dehydrogenates $NbSi_nH_x$, thereby forming a $NbSi_n$ film. The resistivity is obtained from a result of four-terminal electric conductivity measurement. Note that $SiO_2$ was used as a deposition substrate.

The following describes a measurement result of an absorption edge of a $MSi_n$ film, obtained by light absorption spectrum measurement.

The absorption edge of the $MSi_n$ film was measured in order to estimate a band gap of the $MSi_n$ film. Light absorption spectrum of the $MSi_n$ film was measured in the range from 240 nm to 2600 nm of wavelength, and fitting was performed by Tauc method, in order to obtain the absorption edge of the $MSi_n$ film.

Figure 12:
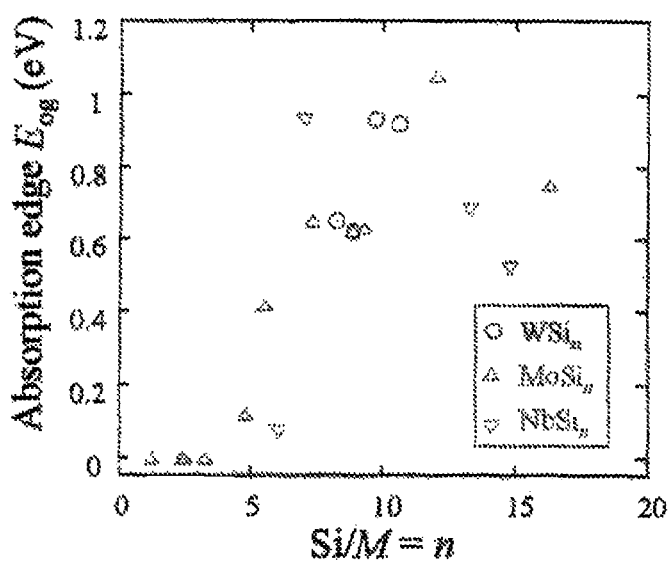
FIG. 12 shows a change of absorption edges of $WSi_n$, $MoSi_n$ and $NbSi_n$ films, plotted against Si/M=n.

FIG. 12 shows composition dependency of an absorption edge of a $MSi_n$ film. Composition ratio "n" of Si to M was calculated by Rutherford backscattering spectrometry and X-ray photoelectron spectroscopy. In a case where n>5, a value of the absorption edge increased along with an increase of the number of "n". Around n=10, the absorption edge became substantially 1 eV. This indicates that the $MSi_n$ becomes more semiconducting as the number of "n" increases, and that a band gap reaches substantially 1 eV around n=10. This change of the absorption edge clearly describes the composition dependency of the resistivity of the $MSi_n$ shown in FIG. 10.

The following describes temperature dependency and activation energy of electric conductivity.

In order to confirm that the $MSi_n$ film has semiconducting conductive mechanism, temperature dependency of electric conductivity of the $MSi_n$ film was examined.

Figure 13:
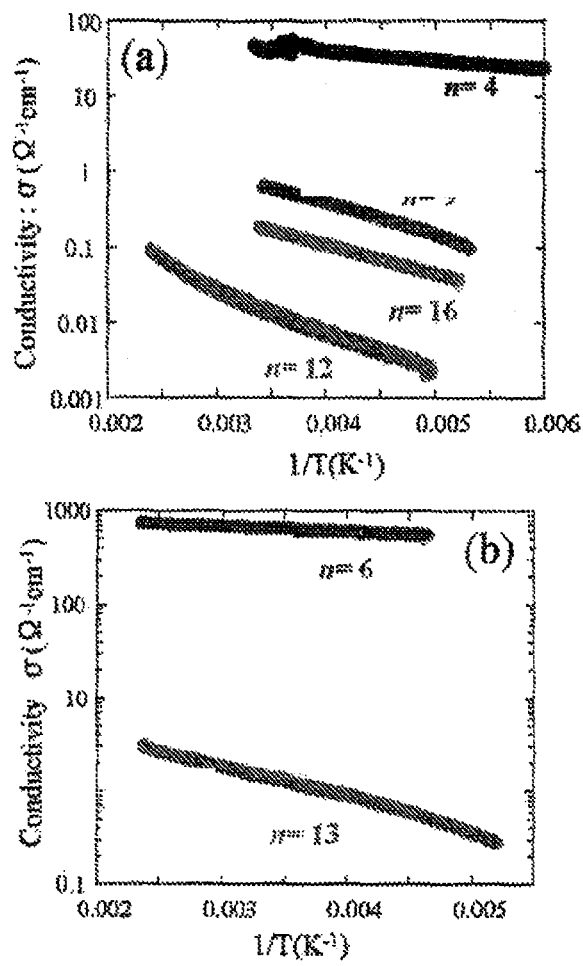
FIG. 13 shows Arrhenius plots indicative of temperature dependence of resistivity of a $MSi_n$ film.

FIG. 13 shows temperature dependency against conductivity of the $MSi_n$ film, that is, an Arrhenius plot. In FIG. 13, (a) represents a $MoSi_n$ film, and (b) represents a $NbSi_n$ film.

As shown in FIG. 13, the conductivity of the $MSi_n$ film increases along with an increase of temperature (T), and the $MSi_n$ film represents a semiconducting feature. The Arrhenius plot representing the conductivity against sample temperature $T^{-1}$ is proportional to $T^{-1}$, and fitting is performed on the conductivity to obtain activation energy $E_a$.

Figure 14:
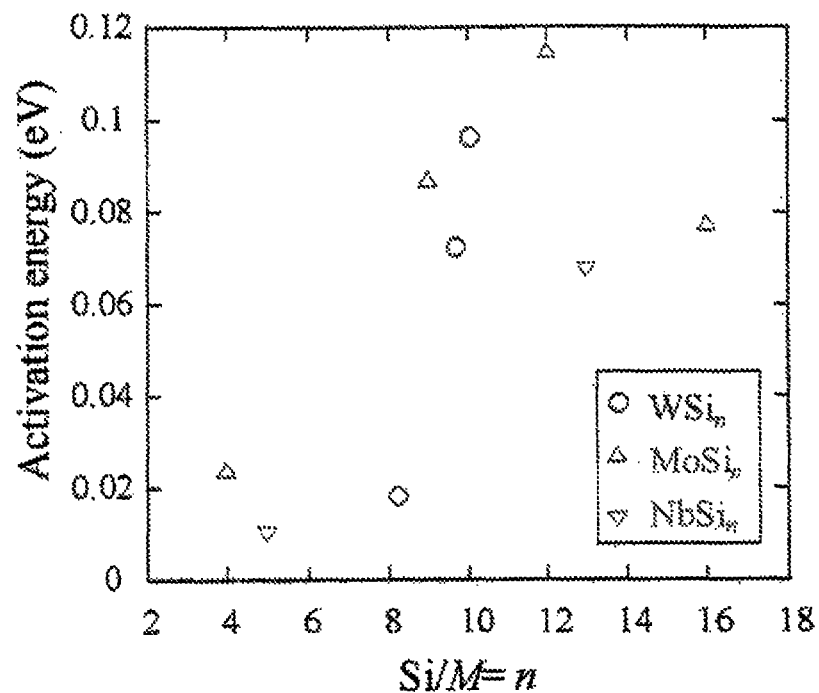
FIG. 14 shows "n" dependence of activation energy of a $MSi_n$ (M is Mo, Nb or W) film.

FIG. 14 shows "n" dependency of activation energy of a $MSi_n$ film. FIG. 14 also shows that the activation energy $E_a$ of electric conductivity of the $MSi_n$ film is prone to increase along with an increase of the number of "n", and that the $MSi_n$ film takes on a semiconducting feature instead of a metal feature. It may be considered that, particularly, activation energy of a NbSi$_5$ is 0.01 eV that is greatly small, and that the NbSi$_5$ has a feature similar to that of metal. Meanwhile, a MoSi$_{12}$ film has 0.12 eV of activation energy, and has substantially at least 0.24 eV of a band gap as a semiconductor material.

In order to show superiority in formation of a film in which MSi$_n$ is a unit, a thin film in which Mo was doped into amorphous silicon was formed, and electric conductivity feature of the thin film was compared to that of another film. An amorphous silicon film whose thickness is 150 nm was formed on a SiO$_2$ substrate by sputter deposition technique. In order to form the amorphous silicon film, a composition in which a ratio of Mo:Si=1:12 was used as a sputtered target. This allowed formation of an amorphous film in which Si/Mo=12. After deposition of the amorphous film, the deposited amorphous film was heated at 500° C. under ultra high vacuum as with the MSi$_n$ film. Resistivity of such a formed Mo-doped amorphous silicon film was 0.24 Ωcm in room temperature. This is substantially one fiftieth lower than 13.4 Ωcm that is resistivity of a MoSi$_{12}$ film. Activation energy of electric conductivity of the Mo-doped amorphous silicon film is 0.048 eV. This is substantially 1/2.5 of the MoSi$_{12}$ film. That is, formation of a cluster film enables formation of a more semiconducting film.

In order to estimate mobility, a carrier type and carrier density of each of MoSi$_n$ and NbSi$_n$ films, Hall effect measurement was performed. Table 2 shows the results. Hall measurement results of the Mo-doped amorphous silicon film are also shown so as to compare to those of the MoSi$_n$ and NbSi$_n$ films. The carrier types of the films are different from each other depending on cluster compositions. In a case of Mo, when "n" was 8, 9 or 12, the carrier type of the MoSi$_n$ film was p-type, and when "n" was 16, the carrier type was n-type. The carrier types are controllable by changing types of M instead of changing a silicon composition. In a case where Nb is used, the carrier types of the NbSi$_n$ film are all n-type. The carrier density is also controllable in the range from 10$^{14}$ cm$^{-3}$ to 10$^{20}$ cm$^{-3}$. These results indicate that changing a deposited cluster makes it possible to determine the carrier type and the carrier density as appropriate. Further, mobility of the MoSi$_n$ film is substantially two to three digits greater than that of the Mo-doped amorphous silicon film. The mobility of the MoSi$_n$ film is greater than that of general amorphous silicon. The NbSi$_n$ film also has higher mobility than that of n-type amorphous silicon. Therefore, the MoSi$_n$ and NbSi$_n$ films can be industrially substituted for the amorphous silicon film. When carrier density of the MoSi$_n$ or NbSi$_n$ film is compared to that of the Mo-doped amorphous silicon film, the carrier density of the MoSi$_n$ film ranges from 10$^{14}$ to 10$^{18}$, and the MoSi$_n$ film is semiconducting. Meanwhile, the carrier density of the Mo-doped amorphous silicon film is 5.4×10$^{20}$. Therefore, it can be considered that the Mo-doped amorphous silicon film represents a metal electronic state. This is a result that corresponds to estimation of the activation energy E$_a$ of the electric conductivity described above.

TABLE 2

| Samples | carrier type | mobility (cm$^2$/Vs) | carrier density (cm$^{-3}$) |
|---|---|---|---|
| MoSi$_8$ | p | 13.1 | 1.3 × 10$^{18}$ |
| MoSi$_9$ | p | 6.9 | 2.5 × 10$^{18}$ |
| MoSi$_{12}$ | p | 32.4 | 1.5 × 10$^{14}$ |
| MoSi$_{16}$ | n | 2.8 | 1.4 × 10$^{18}$ |
| Mo—Si alloy (Si/Mo = 12) | n | 0.05 | 5.4 × 10$^{20}$ |
| NbSi$_7$ | n | 9.88 | 9.9 × 10$^{19}$ |
| NbSi$_{13}$ | n | 3.86 | 4.7 × 10$^{18}$ |
| NbSi$_{15}$ | n | 0.68 | 1.5 × 10$^{20}$ |

Figure 15:
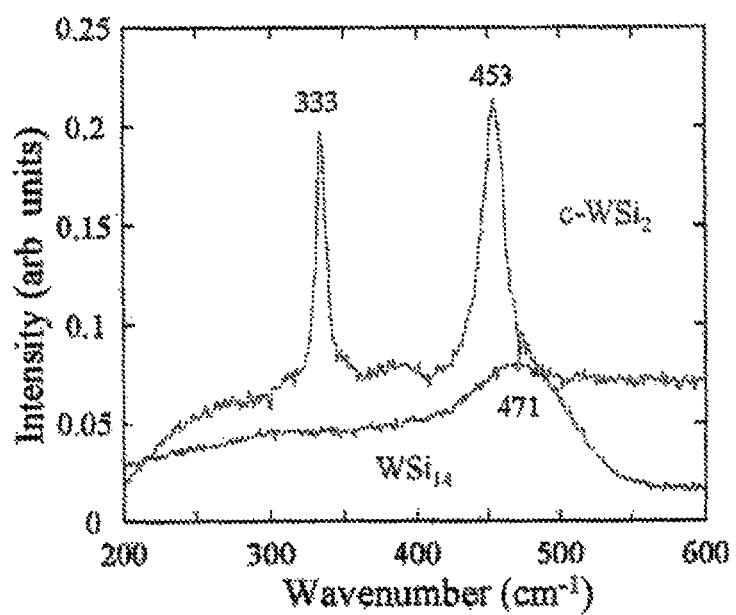
FIG. 15 shows a result of Raman scattering measurement of a crystalline tungsten disilicide ($c$-$WSi_2$) and a $WSi_{14}$ film.

In order to describe structural features of a MSi$_n$ film, FIG. 15 shows a result of Raman scattering measurement of a crystalline tungsten disilicide (c-WSi$_2$) and a WSi$_{14}$ film.

A c-WSi$_2$ has E$_g$ vibration of W—Si around 333 cm$^{-1}$ and A$_{1g}$ vibration of W—Si around 453 cm$^{-1}$ but has no silicon optical phonon which a WSi$_{14}$ film has around 471 cm$^{-1}$. This proves that the WSi$_{14}$ film has a silicon network which the c-WSi$_2$ does not have and which is similar to an a-Si:H film formed therein.

Figure 16:
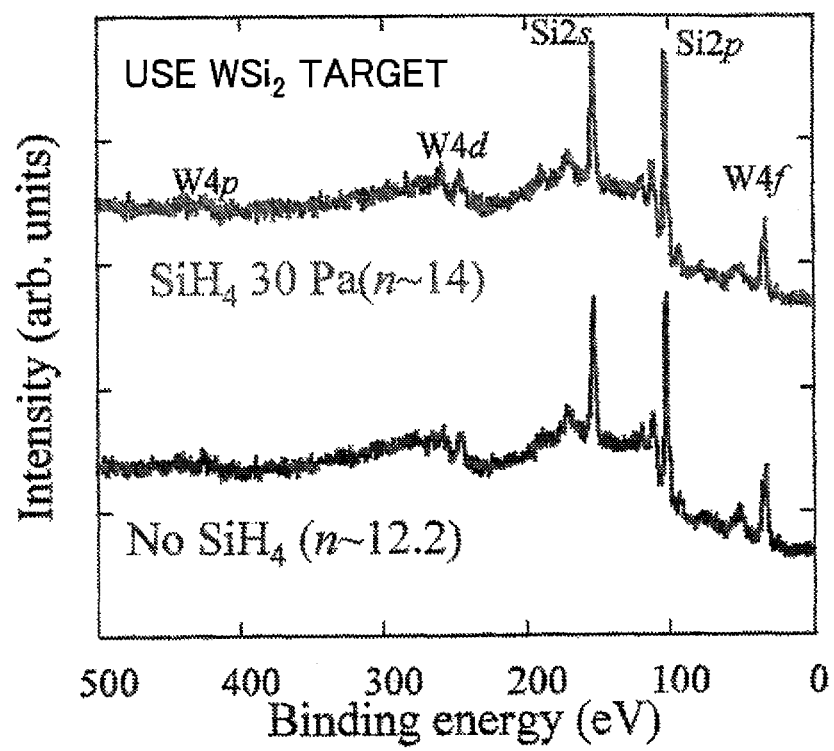
FIG. 16 shows XPS spectrum of a $WSi_n$ film obtained by depositing a $WSi_2$ target at a substrate temperature of 280° C. and then annealing the $WSi_n$ film for 10 minutes at 500° C. under ultra high vacuum.

The following describes a result of composition analysis of a MSi$_n$ film, obtained by X-ray photoelectron spectroscopy. The MSi$_n$ film was made of a compound target of a transition metal atom and silicon. FIG. 16 shows XPS spectrum of a MSi$_n$ film obtained by depositing a WSi$_2$ target at a substrate temperature of 280° C. and then annealing the MSi$_n$ film for 10 minutes at 500° C. under ultra high vacuum. FIG. 16 also shows two cases: a case where no SiH$_4$ is used and a case where 30 Pa of SiH$_4$ is used. From FIG. 16, it is apparent that signals of W 4p, W 4d and W 4f, and signals of Si 2p and Si 2s were formed, and that a W—Si compound was formed. A Si/W composition "n" is estimated from peak intensity ratio of Si 2p3/2 to W 4f7/2: n=12.2 in the case where no SiH$_4$ was used; and n=14 in the case where 30 Pa of SiH$_4$ was used.

The invention claimed is:

1. A thin film of a metal-silicon compound,
the metal silicon-compound being a compound of a transition metal and silicon, in which compound a unit structure is a transition metal-containing silicon cluster;
the transition metal-containing silicon cluster having a structure in which a transition metal atom is surrounded by seven to sixteen silicon atoms, two of which are first and second neighbor atoms to the transition metal atom.

2. The thin film of the metal-silicon compound as set forth in claim 1, wherein:
the transition metal atom is any one of titanium, vanadium, chromium, manganese, iron, cobalt, nickel, zirconium, niobium, molybdenum, ruthenium, rhodium, hafnium, tantalum, tungsten, rhenium, osmium and iridium.

3. The thin film of the metal-silicon compound as set forth in claim 2, wherein:
the transition metal atom is molybdenum or tungsten, and the number of silicon atoms is ten or twelve in the unit structure.

4. A thin film of a hydrogenated metal-silicon compound, being made by hydrogenating a transition metal-containing silicon cluster as set forth in claim 1.

5. A process for producing a thin film of a metal-silicon compound as set forth in claim 1, comprising the steps of:
synthesizing in advance a transition metal-containing silicon cluster in which the transition metal atom is surrounded by four to sixteen silicon atoms; and
agglomerating the synthesized transition metal-containing silicon cluster.

6. A process for producing a thin film of a metal-silicon compound as set forth in claim 1, comprising the step of:
emitting the transition metal atom into monosilane gas by laser ablation method, so as to synthesize the transition metal-containing silicon cluster by gas phase reaction of the transition metal atom with monosilane.

7. A process for producing a thin film of a metal-silicon compound as set forth in claim 1, comprising the step of:
emitting the transition metal atom and a silicon atom from a compound target of the transition metal atom and silicon by laser ablation method, so as to synthesize the transition metal-containing silicon cluster.

8. A process for producing a thin film of a metal-silicon compound as set forth in claim 1, comprising the steps of:
depositing the transition metal-containing silicon cluster on a surface of a solid substrate; and
reacting the deposited transition metal-containing silicon cluster with monosilane, so as to form a structure in which the transition metal atom is surrounded by seven to sixteen silicon atoms.

9. A process for producing a thin film of a hydrogenated metal-silicon compound as set forth in claim 4, comprising the steps of:
synthesizing in advance a hydrogenated transition metal-containing silicon cluster in which the transition metal atom is surrounded by four to sixteen silicon atoms; and
agglomerating the synthesized hydrogenated transition metal-containing silicon cluster.

10. A process for producing a thin film of a hydrogenated metal-silicon compound as set forth in claim 4, comprising the step of:
emitting the transition metal atom into monosilane gas by laser ablation method, so as to synthesize the hydrogenated transition metal-containing silicon cluster by gas phase reaction of the transition metal atom with monosilane.

11. A process for producing a thin film of a hydrogenated metal-silicon compound as set forth in claim 4, comprising the step of:
emitting the transition metal atom and a silicon atom into monosilane gas from a compound target of the transition metal atom and silicon by laser ablation method, so as to synthesize the hydrogenated transition metal-containing silicon cluster by gas phase reaction of the transition metal atom with monosilane.

12. A process for producing a thin film of a hydrogenated metal-silicon compound as set forth in claim 4, comprising the steps of:
depositing the hydrogenated transition metal-containing silicon cluster on a surface of a solid substrate; and
reacting the deposited hydrogenated transition metal-containing silicon cluster with monosilane, so as to form a structure in which the transition metal atom is surrounded by seven to sixteen silicon atoms.

* * * * *

UNITED STATES PATENT AND TRADEMARK OFFICE
CERTIFICATE OF CORRECTION

PATENT NO. : 8,367,030 B2  Page 1 of 1
APPLICATION NO. : 12/919443
DATED : February 5, 2013
INVENTOR(S) : Kanayama et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 279 days.

Signed and Sealed this

First Day of September, 2015

Michelle K. Lee
*Director of the United States Patent and Trademark Office*